United States Patent [19]
Riederer et al.

[11] Patent Number: 5,122,747
[45] Date of Patent: Jun. 16, 1992

[54] SPIRAL THREE-DIMENSIONAL FOURIER TRANSFORM NMR SCAN

[75] Inventors: Stephen J. Riederer; Hope W. Korin, both of Rochester, Minn.

[73] Assignee: Mayo Foundation for Medical Education and Research, Rochester, Minn.

[21] Appl. No.: 617,105

[22] Filed: Nov. 21, 1990

[51] Int. Cl.⁵ .............................................. G01R 33/20
[52] U.S. Cl. ................................... 324/309; 324/312
[58] Field of Search ............... 324/300, 307, 309, 312, 324/308; 128/653 R, 653 A

[56] References Cited

U.S. PATENT DOCUMENTS

| | | | |
|---|---|---|---|
| 4,564,017 | 1/1986 | Glover | 128/653 R |
| 4,567,893 | 2/1986 | Charles et al. | 128/653 A |
| 4,678,996 | 7/1987 | Haacke et al. | 324/309 |
| 4,740,748 | 4/1988 | Rzedzian | 324/309 |
| 4,767,991 | 8/1988 | Rzedzian | 324/312 |
| 4,780,675 | 10/1988 | DeMeester | 324/312 |
| 4,818,942 | 4/1989 | Rzedzian | 324/312 |
| 4,833,407 | 5/1989 | Holland et al. | 324/309 |
| 4,851,779 | 7/1989 | DeMeester | 324/312 |
| 4,857,846 | 8/1989 | Carlson | 324/309 |
| 4,876,508 | 10/1989 | Taylor | 324/309 |
| 4,986,272 | 1/1991 | Riederer | 128/653 A |

*Primary Examiner*—Michael J. Tokar
*Attorney, Agent, or Firm*—Quarles & Brady

[57] ABSTRACT

A 3DFT NMR scan is performed by stepping two phase encoding gradients through a sequence of values to sample all locations in k-space. The gradients are stepped such that k-space is covered by a spiral trajectory that originates at the origin and extends to the periphery of k-space. Alternative embodiments cover k-space with a set of four or eight interleaved spiral trajectories.

11 Claims, 6 Drawing Sheets

SPIRAL THREE-DIMENSIONAL FOURIER TRANSFORM NMR SCAN

BACKGROUND OF THE INVENTION

The field of the invention is nuclear magnetic resonance imaging methods and systems. More particularly, the invention relates to a method for reducing image artifacts caused by flow and motion during a 3 DFT NMR scan and to a method of improving contrast in such images.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_z$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_1$, which is rotating, or spinning, in the x-y plane at the Larmor frequency. The degree to which the net magnetic moment $M_z$ is tipped, and hence the magnitude of the net transverse magnetic moment $M_1$ depends primarily on the length of time and the magnitude of the applied excitation field $B_1$.

The practical value of this phenomenon resides in the signal which is emitted by the excited spins after the excitation signal $B_1$ is terminated. In simple systems the excited spins induce an oscillating sine wave signal in a receiving coil. The frequency of this signal is the Larmor frequency, and its initial amplitude, $A_0$, is determined by the magnitude of the transverse magnetic moment $M_1$.

The NMR measurements of particular relevance to the present invention are called "pulsed NMR measurements". Such NMR measurements are divided into a period of excitation and a period of signal emission. Such measurements are performed in a cyclic manner in which the NMR measurement is repeated many times to accumulate different data during each cycle or to make the same measurement at different locations in the subject.

When utilizing NMR to produce images, a technique is employed to obtain NMR signals from specific locations in the subject. Typically, the region which is to be imaged is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

NMR data for constructing images can be collected using one of many available techniques, such as multiple angle projection reconstruction and Fourier transform (FT). Typically, such techniques comprise a pulse sequence made up of a plurality of sequentially implemented views. Each view may include one or more NMR experiments, each of which comprises at least an RF excitation pulse and a magnetic field gradient pulse to encode spatial information into the resulting NMR signal.

The preferred embodiments of the invention will be described in detail with reference to a variant of the well known FT technique, which is frequently referred to as "spin-warp". The spin-warp technique is discussed in an article entitled "Spin Warp NMR Imaging and Applications to Human Whole-Body Imaging" by W. A. Edelstein et al., *Physics in Medicine and Biology*, Vol. 25, pp. 751–756 (1980).

The spin-warp technique employs a variable amplitude phase encoding magnetic field gradient pulse prior to the acquisition of NMR spin-echo signals to phase encode spatial information in the direction of this gradient. In a two-dimensional implementation (2 DFT), for example, spatial information is encoded in one direction by applying a phase encoding gradient ($G_y$) along that direction, and then a spin-echo signal is acquired in the presence of a read-out magnetic field gradient ($G_x$) in a direction orthogonal to the phase encoding direction. The read-out gradient present during the spin-echo acquisition encodes spatial information in the orthogonal direction. In a typical 2 DFT pulse sequence, the magnitude of the phase encoding gradient pulse $G_y$ is incremented ($\Delta G_y$) in the sequence of views that are acquired during the scan to produce a set of NMR data from which an entire image can be reconstructed.

Object motion during the acquisition of NMR image data produces both blurring and "ghosts" in the phase-encoded direction. Ghosts are particularly apparent when the motion is periodic, or nearly so. For most physiological motion each view of the NMR signal is acquired in a period short enough that the object may be considered stationary during the acquisition window. In such case the blurring and ghosting is due to the inconsistent appearance of the object from view to view.

Three-dimensional magnetic resonance imaging offers many advantages over two-dimensional magnetic resonance imaging. The most prevalent method currently used in clinical applications is a 2 DFT sequence which acquires data from a set of 2 D slices closely spaced along a third dimension through the patient. While such multi-slice methods provide imaging data along the third dimension (i.e. the slice select direction), the resolution in that dimension is relatively low because of the thickness of the excited slices. In addition, the data is not contiguous because of the spacing between slices. While 3 DFT sequences are well-known and they provide the needed resolution and continuity of data along all three dimensions, such sequences are very susceptible to image corruption due to motion. As a result, 3 DFT sequences have been of limited usefulness in the imaging of mobile structures, such as the chest cavity or abdominal cavity of a patient.

Both blurring and ghosting can be reduced if the data acquisition is synchronized with the functional cycle of the object to reduce view-to-view motion. This method is known as gated NMR scanning, and its objective is to acquire NMR data at the same point during successive functional cycles so that the object "looks" the same in each view. The drawback of gating is that NMR data may be acquired only during a small fraction of the cardiac or respiration cycle, and even when the shortest acceptable pulse sequence is employed, the gating technique can significantly lengthen the data acquisition time. Some of these methods are disclosed in U.S. Pat. Nos. 4,751,462; 4,567,893 and 4,663,591. None of them has proven entirely satisfactory because they either depend upon perfectly periodic motion, or they increase the scan time significantly, or they produce low signal-to-noise images.

SUMMARY OF THE INVENTION

The present invention relates to a three-dimensional Fourier transform (3 DFT) NMR scan, and particularly, to the order in which such a scan is executed to acquire NMR data sufficient to reconstruct an image. More particularly, the present invention is a method for performing a scan comprised of a series of NMR pulse sequences in which two phase encoding gradient pulses in each pulse sequence are stepped through a series of values which map out a spiral trajectory during the scan. Each NMR pulse sequence produces an NMR signal which is digitized and stored, and at the completion of the scan these stored signals are Fourier transformed to produce an image. It has been discovered that a scan which samples k-space with a spiral trajectory produces an image which is less susceptible to motion artifacts, is more sensitive to prescan contrast enhancement techniques, and facilitates the use of artifact reduction methods without inordinate increases in scan time.

A general object of the invention is to reduce motion artifacts in 3 DFT NMR images. Not only is the spiral trajectory scan inherently more robust to the effects of patient motion during the scan, but other methods for reducing motion artifacts also become more effective. With a spiral scan, approximately 80% of the image-producing signals can be acquired in the initial 10% of the scan so that breath holding and respiratory or cardiac gating can be used with enhanced effect during this portion of the scan. For example, if the patient is instructed to hold his breath during the initial portion of the spiral scan, a disproportionate amount of image-producing signal can be acquired without motion due to respiration.

Another object of the invention is to improve image contrast when pre-scan preparatory methods are used. Methods such as Snap-Shot GRASS or turbo-FLASH employ pulses at the beginning of the NMR scan which condition the spins to enhance the contrast in the reconstructed image. Unfortunately, the effects of this conditioning decay as the scan is executed so that NMR data acquired at the end of the scan produces less of the desired contrast. When the spiral scan of the present invention is used, the NMR signals which contribute most significantly to the image are acquired at the beginning of the scan when the contrast conditioning is most effective. As a result, contrast is improved. This effect can be enhanced further if the scan is broken into a series of smaller scans which map out a set of interleaved spirals, and each of the smaller spiral scans is preceded by the contrast enhancement pulses.

Yet another object of the invention is to shorten the scan time without significantly reducing the image quality or producing disturbing artifacts. The spiral scan lends itself to the dynamic alteration of the pulse sequence during the scan. For example, the repetition time (TR) of the pulse sequence may be set to a maximum value at the beginning of the spiral scan to improve signal strength and resulting image contrast. As the spiral scan progresses, however, repetition time (TR) is gradually shortened to reduce total scan time. Because the change is gradual, no disturbing artifacts are produced, and because the shorter pulse sequences are used to sample the outer periphery of k-space, image quality is not sacrificed.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
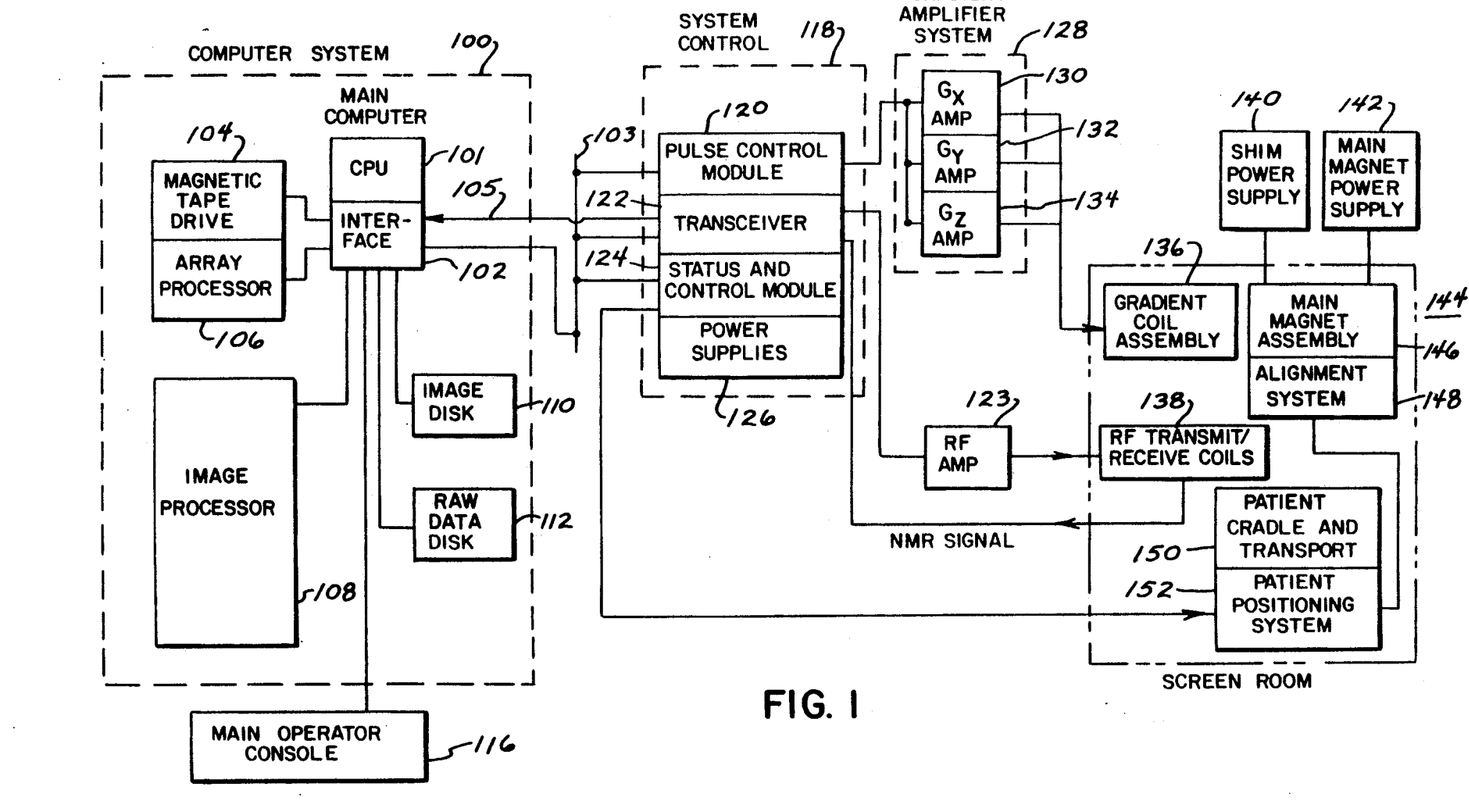
FIG. 1 is a block diagram of an NMR system which employs the present invention.

Referring to FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (a Data General MV4000). The computer 100 includes an interface 102 through which a plurality of computer peripheral devices and other NMR system components are coupled to the main computer 101. Among the computer peripheral devices is a magnetic tape drive 104 which may be utilized under the direction of the main computer 101 for archiving patient data and image data to tape. Processed patient data may also be stored in an image disc storage device designated 110. An array processor 106 is utilized for preprocessing acquired NMR data and for image reconstruction. The function of image processor 108 is to provide interactive image display manipulation such as magnification, image comparison, gray-scale adjustment and real time data display. The computer system 100 also includes a means to store raw NMR data (i.e. before image construction) which employs a disc data storage system designated 112. An operator console 116 is also coupled to the main computer 101 by means of interface 102, and it provides the operator with the means to input data pertinent to a patient study as well as additional data necessary for proper NMR system operation, such as calibrating, initiating and terminating scans. The operator console is also used to display images stored on disc or magnetic tape.

The computer system 100 exercises control over the NMR system by means of a system control 118 and a gradient amplifier system 128. Under the direction of a stored program, the computer 100 communicates with system control 118 by means of a serial communication network 103 (such as the Ethernet network) in a manner well known to those skilled in the art. The system control 118 includes several subsystems such as a pulse control module (PCM) 120, a radio frequency transceiver 122, a status control module (SCM) 124, and power supplies generally designated 126. The PCM 120 utilizes control signals generated under program control by main computer 101 to generate digital waveforms which control gradient coil excitation, as well as RF envelope waveforms utilized in the transceiver 122 for modulating the RF excitation pulses. The gradient waveforms are applied to the gradient amplifier system 128 which is comprised of $G_x$, $G_y$ and $G_z$ amplifiers 130, 132 and 134, respectively. Each amplifier 130, 132 and 134 is utilized to excite a corresponding gradient coil in an assembly designated 136 which is part of a magnet assembly 146. When energized, the gradient coils generate magnetic field gradients $G_x$, $G_y$ and $G_z$.

The gradient magnetic fields are utilized in Combination with radio frequency pulses generated by transceiver 122, RF amp 123 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency signal to an RF power amplifier 123 which then energizes RF coils 138 which are situated within main magnet assembly 146. The NMR signals radiated by the excited spin in the patient are sensed by the same or a different RF coil than is used for transmitting. The signals are detected, amplified, demodulated, filtered, and digitized in the receiver section of the transceiver 122. The processed signals are transmitted to the main computer 101 by means of a dedicated, unidirectional, high-speed digital link 105 which links interface 102 and transceiver 122.

The PCM 120 and SCM 124 are independent subsystems both of which communicate with main computer 101, peripheral systems, such as patient positioning system 152, as well as to one another by means of serial communications link 103. The PCM 120 and SCM 124 are each comprised of a 16-bit microprocessor (such as Intel 8086) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The main power supply 142 is utilized to bring the polarizing field produced by the magnet to the proper operating strength of 1.5 Tesla and is then disconnected.

To minimize interference from external sources, the NMR system components comprised of the main magnet assembly, the gradient coil assembly, and the RF transmit and receiver coils, as well as the patient-handling devices, are enclosed in an RF shielded room generally designated 144. The shielding is generally provided by a copper or aluminum screen network which encloses the entire room. The screen network serves to contain the RF signals generated by the system, while shielding the system from RF signals generated outside the room.

The scan performed by the NMR system is controlled by a program executed by the computer 101. The operator selects a particular pulse sequence to be used and configures the various time intervals to be used in that pulse sequence. A cardiac or respiration monitor may be connected to the computer 101 and a signal therefrom may be used to start, or gate, the performance of the pulse sequence. Once the scan is started by the operator, the program directs the system elements to produce the desired pulses and acquire the NMR signals in accordance with the operator's directions.

Figure 2:
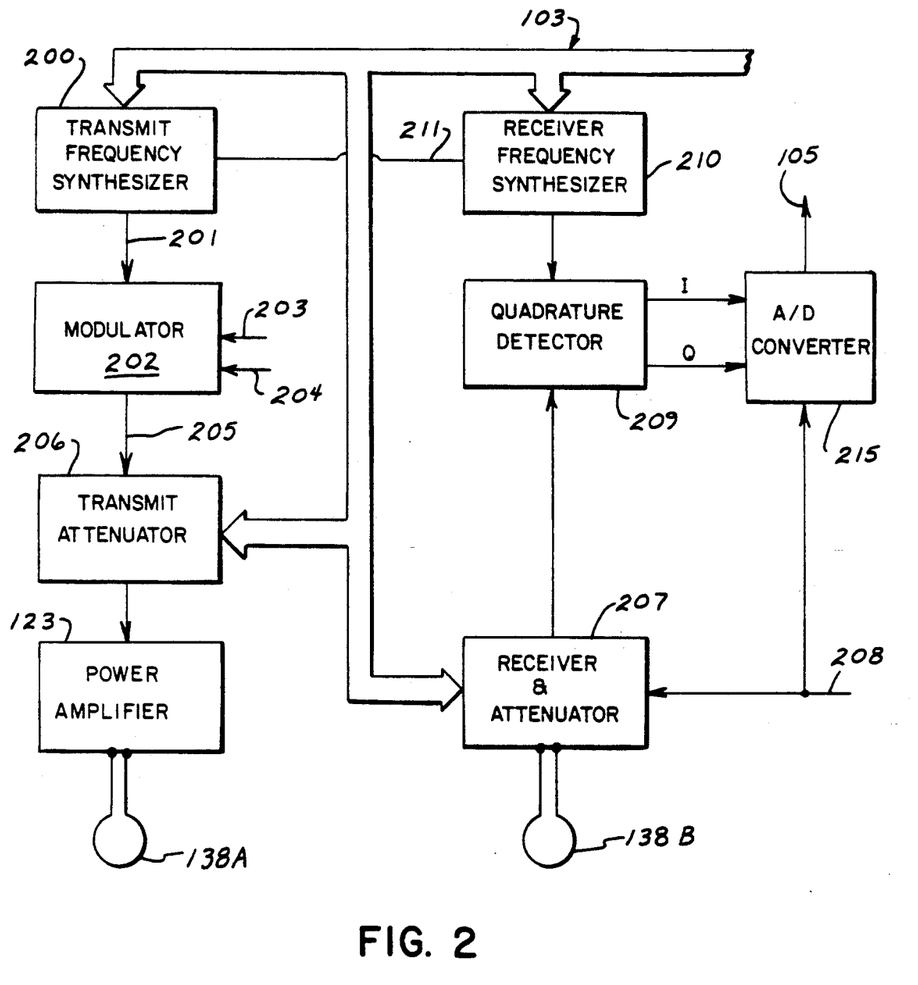
FIG. 2 is an electrical block diagram of the transceiver which forms part of the NMR system of FIG. 1.

Referring particularly to FIGS. 1 and 2, the transceiver includes components which produce the RF excitation field $B_1$ through power amplifier 123 at a coil 138A and components which receive the resulting NMR signal induced in a coil 138B. The base, or carrier, frequency of the RF excitation field is produced by a frequency synthesizer 200 which receives a set of digital signals through the communications link 103 from the main computer 101. These digital signals indicate the frequency which is to be produced at an output 201 at a resolution of one Hertz. This commanded RF carrier is applied to a modulator 202 where it is frequency and amplitude modulated in response to signals received through line 203, and the resulting RF excitation signal is turned on and off in response to a control signal which is received from the PCM 120 through line 204. The magnitude of the RF excitation pulse output through line 205 is attenuated by a transmit attenuator circuit 206 which receives a digital signal from the main computer 101 through communications link 103. The attenuated RF excitation pulses are applied to the power amplifier 123 that drives the RF transmitter coil 138A.

Referring still to FIGS. 1 and 2, the NMR signal produced by the excited spin in the subject is picked up by the receiver coil 138B and applied to the input of a receiver 207. The receiver 207 amplifies the NMR signal and this is attenuated by an amount determined by a digital attenuation signal received from the main computer 101 through link 103. The receiver 207 is also turned on and off by a signal through line 208 from the PCM 120 such that the NMR signal is acquired only over the time intervals required by the particular acquisition being performed.

The received NMR signal is demodulated by a quadrature detector 209 to produce two signals I and Q that are coupled to a pair of analog to digital converters indicated collectively at 215. The quadrature detector 209 also receives an RF reference signal from a second frequency synthesizer 210 and this is employed by the quadrature detector 209 to sense the amplitude of that component of the NMR signal which is in phase with the transmitter RF carrier (I signal) and the amplitude of that component of the NMR signal which is in quadrature therewith (Q signal).

The I and Q components of the received NMR signal are continuously sampled and digitized by the A/D converter 215 at a sample rate of 64 kHz throughout the acquisition period. A set of 256 digital numbers are acquired for each I and Q component of the NMR signal, and these digital numbers are conveyed to the main computer 101 through the serial link 105.

Figure 3:
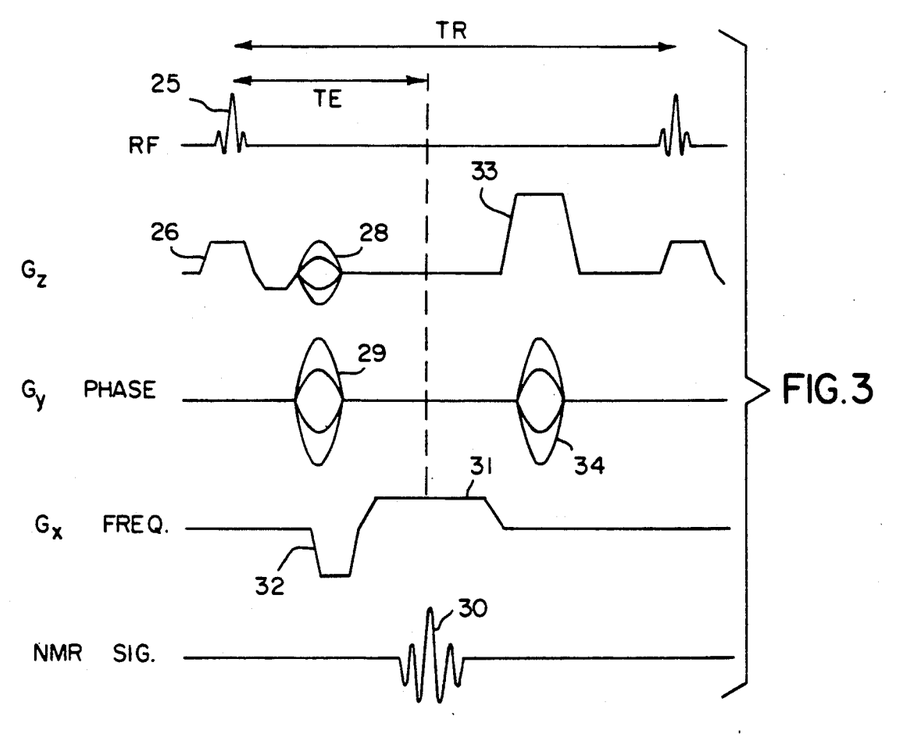
FIG. 3 is a 3 DFT pulse sequence used to practice the preferred embodiment of the invention.

The NMR system of FIG. 1 performs a series of pulse sequences to collect sufficient NMR data to reconstruct an image. Referring particularly to FIG. 3, an exemplary pulse sequence for conducting a 3 DFT NMR scan is shown. The pulse sequence commences by the selective excitation of the entire region of interest with an RF excitation pulse 25 in the presence of a slab select $G_z$ gradient pulse 26. The frequency content of the excitation pulse 25 and the amplitude of the slab select $G_z$ pulse 26 are selected to produce transverse magnetization in the region which is the subject of the 3 D scan. A negative $G_z$ pulse 27 is then produced to rephase the spins in preparation for the phase encoding and readout.

Phase encoding is performed along two axes: the z-axis and the y-axis. The z-axis encoding is accomplished by applying a $G_z$ phase encoding pulse 28 and the y-axis encoding is accomplished by applying a $G_y$ phase encoding pulse 29. As is well-known to those skilled in the art, the magnitude of the phase encoding pulses 28 and 29 are stepped through a series of positive and negative values during the scan, but each is set to one value during each pulse sequence. As will be described in detail below, it is the order in which these phase encoding pulses 28 and 29 are stepped through their set of values which is the subject of the present invention. As is well-known in the art, the magnitude of a phase encoding gradient pulse is determined by the integral of its amplitude over its duration (i.e. its area). In most pulse sequences the duration is kept constant and the phase encoding pulse magnitude is stepped through its values by changing its amplitude.

After phase encoding the transverse magnetization, the NMR signal 30 is read-out and acquired in the presence of a $G_x$ read-out gradient 31. This read-out is preceded by a negative $G_x$ gradient pulse 32 to produce the gradient refocused NMR echo signal 30 in the usual fashion. The 3 DFT pulse sequence is then concluded by the application of a large $G_z$ spoiler gradient pulse 33 and a $G_y$ rewinder gradient pulse 34 to prepare the magnetization for the next pulse sequence which follows immediately. As is known to those skilled in the art, the spoiler pulse 33 dephases transverse magnetization and the rewinder pulse 34 refocuses transverse magnetization along the y-axis in preparation for the next pulse sequence. The rewinder pulse 34 is equal in magnitude, but opposite in polarity with the $G_y$ phase encoding pulse 29.

The acquisition of data in 3 DFT scanning can be considered sampling of a three-dimensional "k-space." Two of the dimensions, $k_y$ and $k_z$, are sampled by applying different phase encoding gradients $G_y$ and $G_z$ during each pulse sequence of the scan, and each acquired NMR signal contains 256 samples along a line in the $k_x$ direction. The pulse sequence is repeated for as many repetitions as are necessary to sample all desired $k_y$ and $k_z$ values. For example, $k_y$ may assume 128 different values and $k_z$ may have 64 values. In this case the number of repetitions of the pulse sequence of FIG. 3 would be $128 \times 64$ or 8192.

With conventional 3 DFT scanning the desired values of $k_y$ and $k_z$ are sampled with two nested loops. For example, the inner loop increments $k_y$ through its 128 values and after all such samples have been made for a given value of $k_z$, the outer loop increments $k_z$. This process continues until all 128 values of $k_y$ have been sampled at each of the 64 values of $k_z$. A diagram of this prior art process is shown in FIG. 1, where the vertical axis indicates the sample along $k_z$ produced by the magnitude of the $G_z$ phase encoding pulse, and the horizontal axis indicates the sample along $k_y$ produced by the magnitude of the $G_y$ phase encoding pulse. The arrow shows the temporal trajectory through ($k_y$, $k_z$) space of the sampling during the scan. The sampling starts in the lower left corner with negative $k_y$ and $k_z$ samples, and ends at the upper right corner with positive $k_y$ and $k_z$ samples. In this conventional scan, therefore, ($k_y$, $k_z$) space is scanned in much the same way as a television screen.

Figure 5:
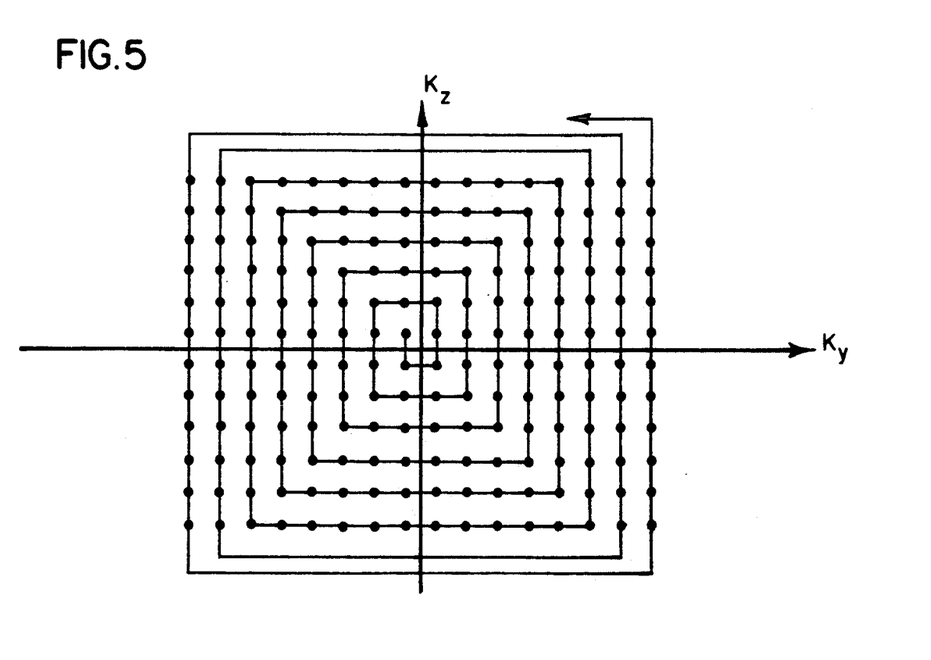
FIG. 5 is a graphic diagram of the preferred k-space scan trajectory of the present invention.
Figure 8:
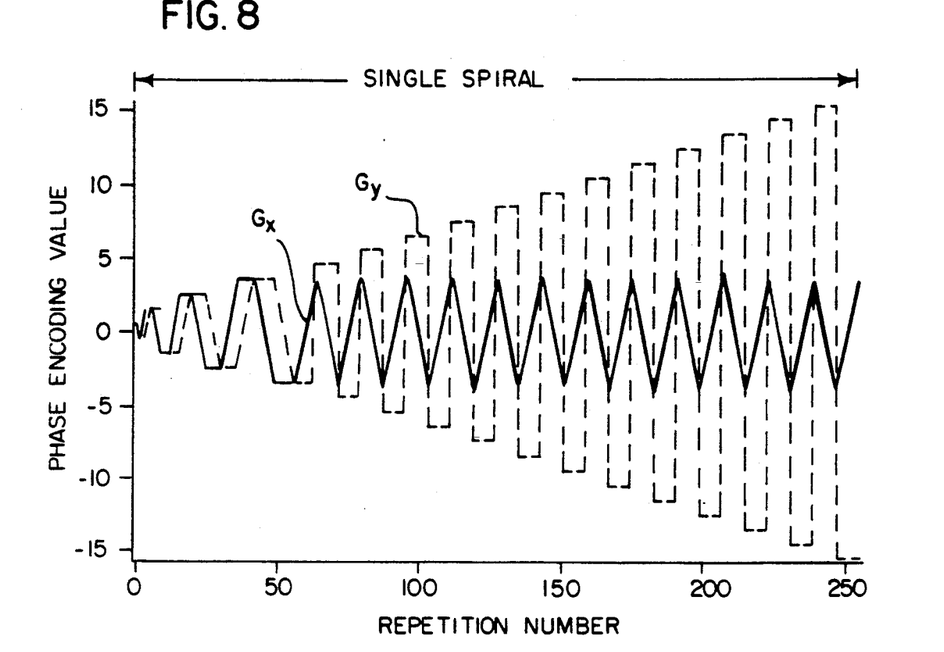
FIGS. 8 & 9 are graphic diagrams of the gradient waveforms used to produce the spiral k-space scan trajectories of FIGS. 5 & 6 respectively.

The present invention is based on the realization that for most objects the bulk of the signal power is contained in the samples taken near the origin of ($k_y$, $k_z$) space, and it is these samples which contribute most significantly to the appearance of the reconstructed image. This results from the fact that the NMR signals acquired during the scan are Fourier transformed along the $k_x$, $k_y$ and $k_z$ directions to produce intensity values for an image in real (x,y,z) space. It is the nature of this transformation that the samples near the origin ($k_y=0$, $k_z=0$) contribute a disproportionate share to the signal power of the reconstructed image. Accordingly, it is a basic idea of this invention to sample the ($k_y$, $k_z$) points which contain the most signal power in as short a time and as close to the beginning of the scan as possible. This can be done by modifying the trajectory with which the ($k_y$, $k_z$) space is sampled. Specifically, we propose the use of a square spiral ($k_y$, $k_z$) trajectory, such as that shown in FIG. 5. The scan starts at or near the origin of ($k_y$, $k_z$) space and progressively works its way outward in a spiral fashion. In FIG. 5 a $12 \times 16$ array of k-space samples are acquired, but this is only illustrative, since in practice many more samples are usually acquired to cover the field of view with adequate resolution. The manner in which the values of the $G_y$ and $G_z$ phase encoding gradients are stepped to accomplish a spiral trajectory scan is shown in FIG. 8. This pattern applies to a scan having eight values of $k_z$ and thirty-two values of $k_y$ for a total of $\times 32 = 256$ samples, or repetitions, of the NMR pulse sequence.

Figure 4:
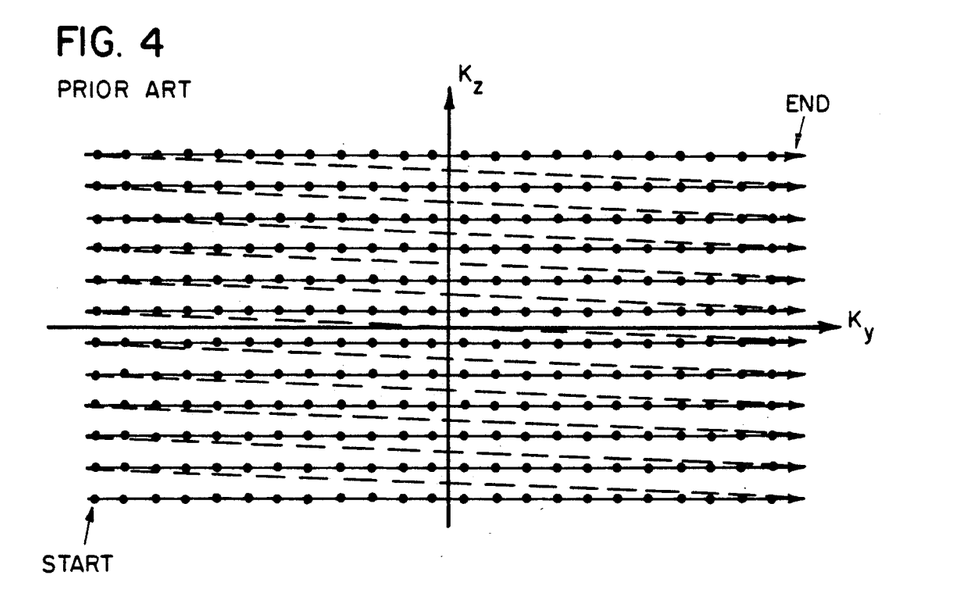
FIG. 4 is a graphic diagram of the prior art k-space scan pattern used in a 3 DFT scan.

One advantage of this square spiral acquisition method is that it is intrinsically less susceptible to motion-induced image artifacts. When the patient moves during an MRI scan the motion causes an inconsistency in the acquired data set in k-space. In particular there are abrupt discontinuities in the phase of the signal in going from one ($k_y$, $k_z$) point to an adjacent point if the motion occurs during the time interval between the sampling of the two points. Additionally, the magnitude of the error is proportional to the magnitude of the signal measured at the affected k-space points. In the prior method for ordering of samples shown in FIG. 4, the time interval between measurement of successive samples along the $k_z$ direction is equal to $N_y$ TR, where $N_y$ is the number of samples along $k_y$ and TR is the pulse sequence repetition time. Using typical values of 128 samples and 20 msec, this time can be 2.5 sec.

In contrast, the square spiral trajectory of the present invention minimizes the time delay between the measurement of adjacent $k_y$ and $k_z$ samples for those samples in which the signal magnitudes are known to be large. Approximately 80% of the total signal contribution to the reconstructed image is derived from the samples acquired within that 10% of the total $(k_y\ k_z)$ space which is centered about the origin $(k_y=0, k_z=0)$. In the spiral trajectory, those samples near the k-space origin are sampled at approximately the same time during the scan. In particular, it is possible to sample the entire central 10% of the desired k-space region within about 10 seconds. The largest time gap between samples in the square spiral trajectory is always equal to or smaller than that between samples in the standard trajectory whatever the choice of $k_y$ and $k_z$. Moreover, the largest time gaps between adjacent samples in the spiral always occur well away from the origin of k-space where the signals contribute less to the reconstructed image.

In addition to the fact that this spiral k-space trajectory is itself less susceptible to motion effects, it also enhances other motion reduction techniques. For example, a breath hold for the first 10 seconds of the scan to acquire the center 10% of k-space with no motion is easily achievable. The patient can resume breathing during the remainder of the scan when the peripheral regions of k-space are acquired. Similarly, gating can be used during the early part of the spiral scan to minimize motion artifacts, and the gating can be eliminated during the later part of the spiral scan when motion has less detrimental effects on the reconstructed image. In other words, the scan time is degraded by gating only during the initial 10% of the samples.

Figure 10:
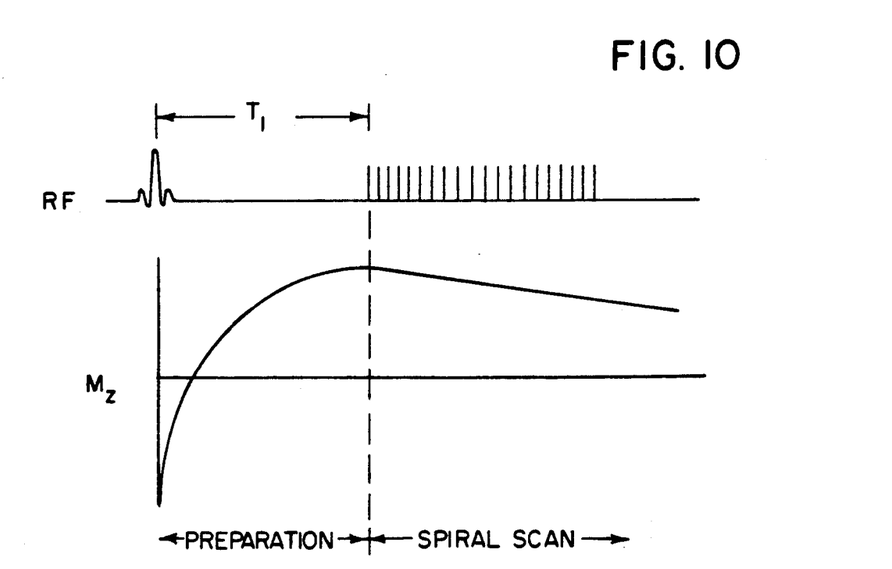
FIG. 10 is a graphic representation of a spiral trajectory scan according to the present invention which is preceded by a contrast enhancement preparation pulse.

The square spiral trajectory is also useful in 3 D fast imaging sequences that employ a "preparatory phase" to control image contrast. In these methods, one or more pulses are applied to prepare the magnetization before data acquisition begins. Such a scan is shown in FIG. 10 where a 180° RF excitation pulse is applied during the preparation phase, and at a time interval $T_1$ thereafter, the spiral scan is begun when the magnetization $M_z$ is at a maximum. The prepared magnetization decays as data acquisition proceeds so that the desired contrast fades during the scan. By using the spiral k-space scan of the present invention, however, the central region of k-space is acquired quickly while the contrast is maximum, and these acquired signals contribute more strongly to the resulting image.

Figure 6:
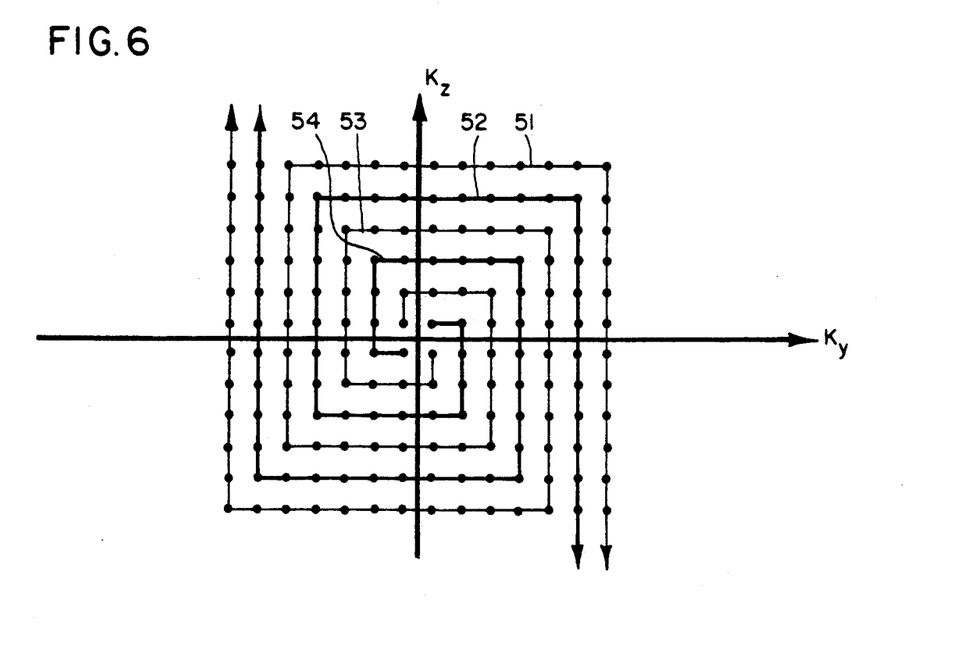
FIGS. 6 & 7 are alternative embodiments of the k-space scan trajectory of the present invention.
Figure 7:
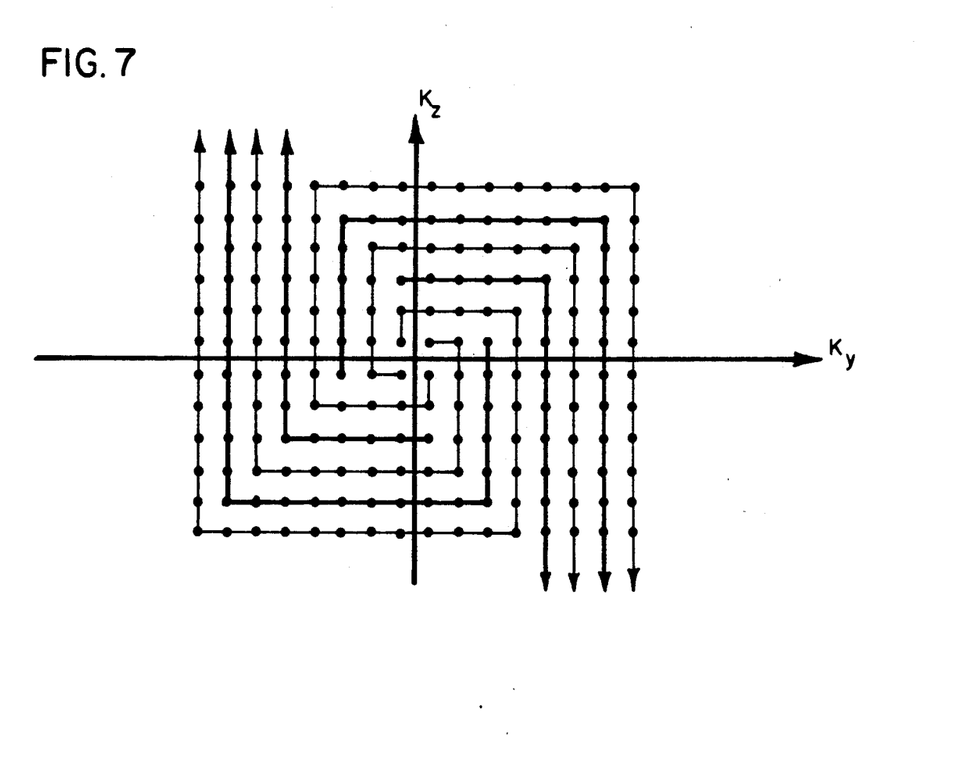
Figure 9:
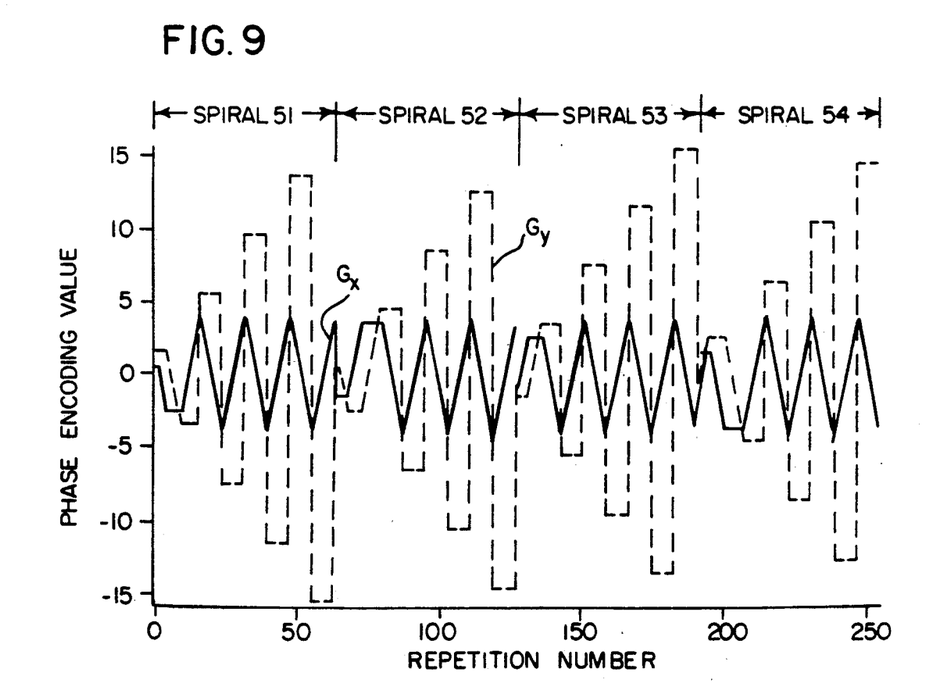

An alternative embodiment of the present invention is to scan k-space with a plurality of interleaved spiral trajectory patterns. Each interleaved spiral trajectory starts near the origin of $(k_y\ k_z)$ space and proceeds outward. Two examples with four and eight interleaved spirals respectively are shown in FIGS. 6 and 7. The manner in which the $G_y$ and $G_z$ gradient pulses are stepped through their values to produce the four interleaved spiral trajectories 51, 52, 53 and 54 of FIG. 6 is illustrated in FIG. 9. The first portion of each spiral 51-54 samples near the origin of $(k_y\ k_z)$ space where a preponderance of the signals needed to reconstruct an image are produced. Whereas 10% of $(k_y\ k_z)$ space might be scanned in 10 seconds with the single spiral pattern of FIG. 5, the same 10% of $(k_y\ k_z)$ space might be scanned in 2.5 seconds of the beginning of each of the four interleaved spiral 51-54.

The interleaved spiral pattern has distinct advantages when used in conjunction with a fast scan, prepared contrast, NMR technique. In such applications, each spiral has its own contrast preparation phase. Where the contrast mechanism decays rapidly with time during the scan, the fourfold, or eightfold shortening of the time needed to scan the central 10% of $(k_y\ k_z)$ space after contrast preparation makes the interleaved spirals more advantageous than the single spiral. Due to the large time intervals between some adjacent samples in the interleaved spiral scan, such patterns are inherently less robust to motion artifacts. However, if fast scanning pulse sequences are used, it is also possible to acquire each interleaved spiral within a separate breath hold. Eight or more interleaved spirals are appropriate for this technique. Any discrepancy in organ position from breath hold to breath hold can be corrected by measuring a single "navigator" echo for each spiral and retrospectively correcting the acquired NMR data for shifts in position as described in U.S. Pat. No. 4,937,526 entitled "Adaptive Method For Reducing Motion and Flow Artifacts in NMR Images" which is hereby incorporated by reference. Such shifts in patient position between spiral scans can also be detected and measured in a number of other ways.

The spiral trajectory scan also lends itself well to a dynamic reduction of the repetition time (TR) during the scan. In this technique, the TR of the pulse sequence is set to a maximum at the beginning of the spiral scan, then at some point during the scan, the TR is ramped down to a shorter minimum value. Gradient echo sequences with longer TR's produce higher signal images with better contrast characteristics, but the total scan time for a 3 D acquisition with long TR's quickly becomes prohibitively long. For instance, a "static" scan requiring 64×256 views and using a 60 msec TR takes sixteen and a half minutes. Using the spiral trajectory scan with an initial TR of 60 msec for the central portion of k-space (e.g. the central 32×32 views) then gradually reducing the TR to its minimum value (24 msec in the standard 3 D pulse sequence) allows the "dynamic" scan to be completed in about eight and a half minutes. Since the central area of k-space containing the majority of signal power is acquired at the long TR, the contrast and signal properties of the final images will be virtually the same between the static and dynamically reduced TR scan, while the latter offers large time savings. In the example cited, the time savings is 48%.

Any abrupt variation of TR during a pulse sequence will tend to cause artifacts in the final images. To avoid this, the TR must be changed as gradually and monotonically as possible. The square trajectory scan allows a long TR in the center of k-space and a gradual reduction in TR as the scan winds its way to the periphery of k-space. Sudden changes in TR during the scan which might produce disturbing artifacts are thus avoided.

We claim:

1. A method for acquiring an NMR data set which is employed to reconstruct an image using a Fourier transformation, the steps comprising:

performing an NMR pulse sequence in an NMR system to acquire sample NMR data for the NMR data set, the NMR pulse sequence including a first phase encoding gradient pulse having a magnitude which determines the location of the sample NMR data along a first axis in a two-dimensional k-space, and a second phase encoding gradient pulse having a magnitude which determines the location of the sample NMR data along a second axis in the two-dimensional k-space;

repeating the NMR pulse sequence to acquire sample NMR data for the NMR data set from locations in a region surrounding the origin of said two-dimensional k-space, the magnitudes of said first and second phase encoding gradient pulses being stepped through values such that the location of successive samples forms a spiral trajectory in the two-dimensional k-space.

2. The method as recited in claim 1 in which the trajectory formed by successive samples is a series of interleaved spirals.

3. The method as recited in claim 1 in which the spiral trajectory is formed initially near the origin of k-space and the sampling traverses the spiral trajectory away from the origin during successive samples.

4. A method for acquiring a three-dimensional NMR data set for reconstructing an image using a Fourier transformation, which comprises:

performing a scan comprised of a series of NMR pulse sequences, each NMR pulse sequence including:

producing a first phase encoding gradient pulse having a gradient directed along one of the three dimensions, and having a magnitude which is stepped through a series of values during the scan;

producing a second phase encoding gradient pulse having a gradient directed along a second of said three dimensions, and having a magnitude which is stepped through a series of values during the scan;

producing a read-out gradient pulse having a gradient directed along the third of said three dimensions; and acquiring an NMR signal for the NMR data set during the production of the read-out gradient;

wherein the series of values through which the magnitudes of the first and second phase encoding pulses are stepped during the scan map out a spiral trajectory in a two-dimensional k-space.

5. The method as recited in claim 4 in which the magnitudes of the first and second phase encoding pulses are stepped through a series of values during the scan which map out a plurality of interleaved spiral trajectories in two-dimensional k-space.

6. The method as recited in claim 5 in which each interleaved spiral trajectory begins near the origin of two-dimensional k-space and the NMR pulse sequence at the beginning of each interleaved spiral trajectory is preceded by a contrast enhancement pulse.

7. The method as recited in claim 4 in which the spiral trajectory mapped out during the scan begins near the origin of the two-dimensional k-space and extends away therefrom during the scan.

8. A method for reducing motion artifacts in a 3 DFT NMR image which comprises:

performing a 3 DFT scan comprised of a series of 3 DFT pulse sequences in which two phase encoding gradients are stepped through values which produce NMR signals that sample a region surrounding the origin of a two-dimensional k-space, such that an area near the origin is sampled initially during the scan and sampling progresses away from the origin as the scan is performed; and employing a motion artifact suppression technique during an initial portion of the scan during which the area near the origin is sampled.

9. The method as recited in claim 8 in which a human patient is the subject of the scan and the motion artifact suppression technique employed is a breath hold during the initial portion of the scan.

10. The method as recited in claim 8 in which a human patient is the subject of the scan and the motion artifact suppression technique employed is gating the performance of the 3 DFT pulse sequences during the initial portion of the scan such that patient motion is minimized during the sampling of the area near the origin.

11. A method for reducing motion artifacts in a 3 DFT NMR image which comprises:

performing a 3 DFT scan comprised of a series of 3 DFT pulse sequences in which two phase encoding gradients are stepped through values which produce NMR signals that sample a region surrounding the origin of a two-dimensional k-space, such that an area near the origin is sampled initially during the scan and sampling progresses away from the origin as the scan is performed; and in which the repetition time (TR) of the 3 DFT pulse sequence is set to a maximum value during the sampling of the region surrounding the origin of k-space and the repetition time (TR) of the 3 DFT pulse sequence is shortened as sampling progresses away from the origin.

* * * * *

UNITED STATES PATENT AND TRADEMARK OFFICE
CERTIFICATE OF CORRECTION

Patent No.   : 5,122,747
Dated        : June 16, 1992
Inventor(s)  : S.J. Riederer, et al.

It is certified that error appears in the above-identified patent and that said Letters Patent is hereby corrected as shown below:

Column 1, line 3, insert the following:

-- This invention was made with U.S. Government support awarded by the National Institutes of Health (NIH) Grant No.: HL 37310-03. The U.S. Government has certain rights in this invention. --

Signed and Sealed this

Twelfth Day of August, 1997

Attest:

BRUCE LEHMAN

Attesting Officer

Commissioner of Patents and Trademarks